United States Patent
Klipp et al.

(10) Patent No.: US 9,184,057 B2
(45) Date of Patent: Nov. 10, 2015

(54) METHOD FOR MANUFACTURING INTEGRATED CIRCUIT DEVICES, OPTICAL DEVICES, MICROMACHINES AND MECHANICAL PRECISION DEVICES HAVING PATTERNED MATERIAL LAYERS WITH LINE-SPACE DIMENSIONS OF 50 NM AND LESS

(75) Inventors: Andreas Klipp, Lambsheim (DE); Guenter Oetter, Frankenthal (DE); Sabrina Montero Pancera, Viernheim (DE); Andrei Honciuc, Ludwigshafen (DE); Christian Bittner, Bensheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/005,746

(22) PCT Filed: Feb. 29, 2012

(86) PCT No.: PCT/IB2012/050946
§ 371 (c)(1),
(2), (4) Date: Sep. 17, 2013

(87) PCT Pub. No.: WO2012/127342
PCT Pub. Date: Sep. 27, 2012

(65) Prior Publication Data
US 2014/0011366 A1    Jan. 9, 2014

Related U.S. Application Data

(60) Provisional application No. 61/453,983, filed on Mar. 18, 2011, provisional application No. 61/543,834, filed on Oct. 6, 2011.

(51) Int. Cl.
*G03F 7/32*     (2006.01)
*G03F 7/40*     (2006.01)
(Continued)

(52) U.S. Cl.
CPC .......... *H01L 21/3083* (2013.01); *G03F 7/2041* (2013.01); *G03F 7/322* (2013.01); *G03F 7/405* (2013.01)

(58) Field of Classification Search
CPC ... H02L 21/3083; G03F 7/405; G03F 7/2002; G03F 7/30; G03F 7/2041
USPC ......................................... 430/311, 322, 325
See application file for complete search history.

(56) References Cited

U.S. PATENT DOCUMENTS 6,599,683 B1 *  7/2003  Torek et al. ................... 430/326
7,795,197 B2    9/2010  Sawads et al.
(Continued)

FOREIGN PATENT DOCUMENTS

EP    0 186 184 A2    7/1986
EP    1 553 454 A2    7/2005
(Continued)

OTHER PUBLICATIONS

International Search Report Issued Jul. 12, 2012 in PCT/IB12/050946 Filed Feb. 29, 2012.
(Continued)

*Primary Examiner* — Brittany Raymond
(74) *Attorney, Agent, or Firm* — Oblon, McClelland, Maier & Neustadt, L.L.P.

(57) ABSTRACT

A method for manufacturing integrated circuit devices, optical devices, micromachines and mechanical precision devices, the said method comprising the steps of (1) providing a substrate having patterned material layers having line-space dimensions of 50 nm and less and aspect ratios of >2; (2) providing the surface of the patterned material layers with a positive or a negative electrical charge by contacting the substrate at least once with an aqueous, fluorine-free solution S containing at least one fluorine-free cationic surfactant A having at least one cationic or potentially cationic group, at least one fluorine-free anionic surfactant A having at least one anionic or potentially anionic group, or at least one fluorine-free amphoteric surfactant A; and (3) removing the aqueous, fluorine-free solution S from the contact with the substrate.

19 Claims, 3 Drawing Sheets

Figure 1:
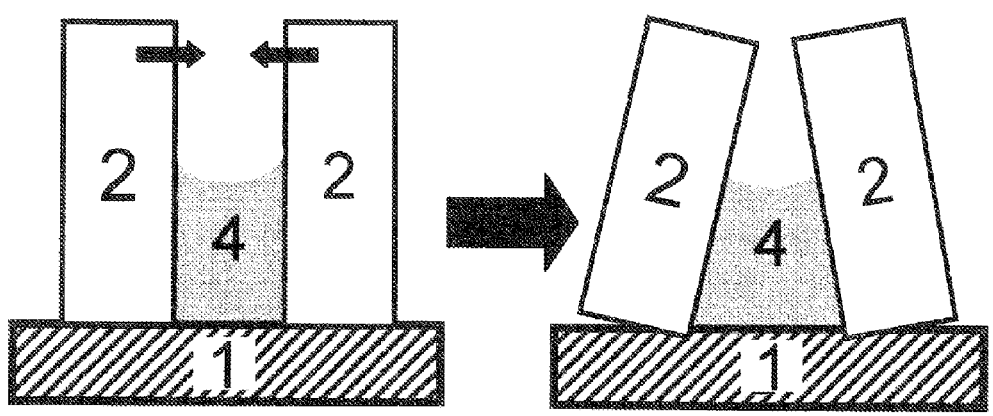

(51) Int. Cl.
*H01L 21/308* (2006.01)
*G03F 7/20* (2006.01)

(56) References Cited

U.S. PATENT DOCUMENTS

| | | | |
|---|---|---|---|
| 8,475,662 | B2 | 7/2013 | Domke et al. |
| 2002/0058207 | A1* | 5/2002 | Urano et al. ................. 430/302 |
| 2002/0132184 | A1* | 9/2002 | Babcock ..................... 430/270.1 |
| 2004/0259004 | A1* | 12/2004 | Wunnicke et al. ................. 430/5 |
| 2005/0158672 | A1 | 7/2005 | Endo et al. |
| 2006/0194404 | A1* | 8/2006 | Dupont et al. ................. 438/397 |
| 2008/0280230 | A1 | 11/2008 | Chang et al. |
| 2008/0299487 | A1 | 12/2008 | Chang et al. |
| 2009/0004608 | A1 | 1/2009 | Sawada et al. |
| 2009/0264525 | A1 | 10/2009 | Hierse et al. |
| 2010/0122711 | A1* | 5/2010 | Ryan ................................ 134/2 |
| 2010/0248164 | A1* | 9/2010 | Kumagai et al. ............. 430/325 |
| 2011/0083846 | A1 | 4/2011 | Bittner et al. |
| 2011/0083847 | A1 | 4/2011 | Bittner et al. |
| 2011/0083848 | A1 | 4/2011 | Bittner et al. |
| 2011/0120207 | A1 | 5/2011 | Gabriel et al. |
| 2011/0220353 | A1 | 9/2011 | Bittner et al. |
| 2011/0220364 | A1 | 9/2011 | Bittner et al. |
| 2011/0220365 | A1 | 9/2011 | Bittner et al. |
| 2011/0220366 | A1 | 9/2011 | Bittner et al. |
| 2011/0259583 | A1 | 10/2011 | Bittner et al. |
| 2011/0263467 | A1 | 10/2011 | Bittner et al. |
| 2011/0281779 | A1 | 11/2011 | Weerasooriya et al. |
| 2011/0288322 | A1 | 11/2011 | Garcia et al. |
| 2012/0040529 | A1 | 2/2012 | Klipp |
| 2012/0058644 | A1 | 3/2012 | Klipp |
| 2012/0083497 | A1 | 4/2012 | Riggs et al. |
| 2012/0094886 | A1 | 4/2012 | Mellies et al. |
| 2012/0101308 | A1 | 4/2012 | Montero Pancera et al. |
| 2012/0129747 | A1 | 5/2012 | Chen et al. |
| 2012/0135604 | A1 | 5/2012 | Ohto et al. |
| 2012/0142573 | A1 | 6/2012 | Montero Pancera et al. |
| 2012/0184479 | A1 | 7/2012 | Maitro-Vogel et al. |
| 2012/0220502 | A1 | 8/2012 | Jürgenson et al. |
| 2012/0220696 | A1 | 8/2012 | Nicoleau et al. |
| 2012/0263973 | A1 | 10/2012 | Montero Pancera et al. |
| 2012/0291339 | A1 | 11/2012 | Martin et al. |
| 2013/0157919 | A1 | 6/2013 | Mellies et al. |
| 2013/0171765 | A1 | 7/2013 | Braun et al. |

FOREIGN PATENT DOCUMENTS

| | | | |
|---|---|---|---|
| EP | 2 605 069 | A1 | 6/2013 |
| EP | 2 615 631 | A1 | 7/2013 |
| JP | 2007-258638 | A | 10/2007 |
| TW | 2010 35307 | | 10/2010 |
| WO | 2008 003443 | | 1/2008 |
| WO | 2008 003445 | | 1/2008 |
| WO | 2008 003446 | | 1/2008 |
| WO | 2008 140083 | | 11/2008 |
| WO | 2009 149807 | | 12/2009 |
| WO | 2010 115720 | | 10/2010 |
| WO | 2010 127941 | | 11/2010 |
| WO | 2010 127942 | | 11/2010 |
| WO | 2010 127943 | | 11/2010 |
| WO | 2011 000694 | | 1/2011 |
| WO | 2011 000758 | | 1/2011 |
| WO | 2011 000854 | | 1/2011 |
| WO | 2011 012559 | | 2/2011 |
| WO | WO 2011/016337 | A1 | 2/2011 |
| WO | 2011 026720 | | 3/2011 |
| WO | 2011 045204 | | 4/2011 |
| WO | 2011 045205 | | 4/2011 |
| WO | 2011 045254 | | 4/2011 |
| WO | 2011 064323 | | 6/2011 |
| WO | 2011 069931 | | 6/2011 |
| WO | 2011 110501 | | 9/2011 |
| WO | 2011 110502 | | 9/2011 |
| WO | 2011 110503 | | 9/2011 |
| WO | 2011 110601 | | 9/2011 |
| WO | 2011 130310 | | 10/2011 |
| WO | 2011 131549 | | 10/2011 |
| WO | 2011 131719 | | 10/2011 |
| WO | 2011 144643 | | 11/2011 |
| WO | 2012 011020 | | 1/2012 |
| WO | 2012 029000 | | 3/2012 |
| WO | WO 2012/027667 | A2 | 3/2012 |
| WO | 2012 073211 | | 6/2012 |
| WO | 2012 095481 | | 7/2012 |
| WO | 2012 101545 | | 8/2012 |
| WO | 2012 113861 | | 8/2012 |

OTHER PUBLICATIONS

U.S. Appl. No. 13/979,076, filed Jul. 10, 2013, Klipp, et al.
Extended European Search Report issued Aug. 1, 2014 in Patent Application No. 12761512.8.
Kwangjoo Lee, et al., "Amplification of the index of refraction of aqueous immersion fluids by ionic surfactants", Proceedings of SPIE, vol. 5753, XP055002751, Jan. 1, 2005, pp. 537-553.
Partial European Search Report issued Aug. 1, 2011 in Patent Application No. 11158833.1.
U.S. Appl. No. 14/412,737, filed Jan. 5, 2015, Klipp, et al.

* cited by examiner

METHOD FOR MANUFACTURING INTEGRATED CIRCUIT DEVICES, OPTICAL DEVICES, MICROMACHINES AND MECHANICAL PRECISION DEVICES HAVING PATTERNED MATERIAL LAYERS WITH LINE-SPACE DIMENSIONS OF 50 NM AND LESS

The present invention is directed to a novel method for manufacturing integrated circuits devices, optical devices, micromachines and mechanical precision devices having patterned material layers having line-space dimensions of 50 nm and less and aspect ratios >2.

CITED DOCUMENTS

The documents cited in the present application are incorporated by reference in their entirety.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Nowadays, such patterned material layers comprise structures of dimensions even below 20 nm with high aspect ratios.

Photolithography is a method in which a pattern on a mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm, through the mask. In order to extend the 193 nm photolithography to the 20 nm and the 15 nm technology node, immersion photolithography has been developed as a resolution enhancement technique. In this technique, the air gap between the final lens of the optical system and the photoresist surface is replaced by a liquid medium that has a refractive index greater than one, e.g., ultra pure water with a refractive index of 1.44 for the wavelength of 193 nm. However, in order to avoid leaching, water-uptake and pattern degradation, a barrier coating or a water resistant photoresist must be used. These measures however add to the complexity of the manufacturing process and are therefore disadvantageous.

Besides the 193 nm immersion lithography, other irradiation techniques using significant shorter wavelengths are considered to be solutions which fulfil the needs of further downscaling of the to be printed feature sizes of the 20 nm technology node and below. Besides electron beam (eBeam) exposure, the Extreme Ultraviolett (EUV) lithography with a wavelength of about 13.5 nm seems to be the most promising candidate to replace immersion lithography in the future. After the exposure, the subsequent process flow is quite similar for immersion eBeam and EUV lithography as described in the following paragraph.

A post-exposure bake (PEB) is often performed to allow the exposed photoresist polymers to cleave. The substrate including the cleaved polymer photoresist is then transferred to a developing chamber to remove the exposed photoresist, which is soluble in aqueous developer solutions. Typically, a developer solution such as tetramethylammonium hydroxide (TMAH) is applied to the resist surface in the form of a puddle to develop the exposed photoresist. A deionized water rinse is then applied to the substrate to remove the dissolved polymers of the photoresists. The substrate is then sent to a spin drying process. Thereafter, the substrate can be transferred to the next process step, which may include a hard bake process to remove any moisture from the photoresist surface.

Irrespective of the exposure techniques, the wet chemical processing of small patterns involves however a plurality of problems. As technologies advance and dimension requirements become stricter and stricter, photoresist patterns are required to include relatively thin and tall structures or features of photoresists, i.e., features having a high aspect ratio, on the substrate. These structures may suffer from bending and/or collapsing, in particular, during the spin dry process, due to excessive capillary forces of the deionized water remaining from the chemical rinse and spin dry processes and being disposed between adjacent photoresist features. The maximum stress a between small features caused by the capillary forces can be defined as follows:

$$\sigma = \frac{6 \cdot \gamma \cdot \cos\theta}{D} \cdot \left(\frac{H}{W}\right)^2$$

wherein $\gamma$=surface tension of the fluid, $\theta$=contact angle of the fluid on the feature material surface, D=distance between the features, H=height of the features, and W=width of the features. Consequently, the surface tension of the chemical rinse solutions must be significantly lowered.

Another solution for immersion lithography may include using a photoresist with modified polymers to make it more hydrophobic. However, this solution may decrease the wettability of the developing solution.

Another problem of the conventional photolithographic process is line edge roughness (LER) due to resist and optical resolution limits. LER includes horizontal and vertical deviations from the feature's ideal form. Especially as critical dimensions shrink, the LER becomes more problematic and may cause yield loss in the manufacturing process of IC devices.

Due to the shrinkage of the dimensions, the removal of particles in order to achieve a defect reduction becomes also a critical factor. This does not only apply to photoresist patterns but also to other patterned material layers which are generated during the manufacture of optical devices, micromachines and mechanical precision devices.

An additional problem of the conventional photolithographic process is the presence of watermark defects. Watermarks may form on the photoresist as the deionized water or rinse liquid cannot be spun off from the hydrophobic surface of the photoresist. The photoresist may be hydrophobic particularly in areas of isolated, or non-dense, patterning. The watermarks have a harmful effect on yield and IC device performance.

The American patent application US 2008/0280230 A1 discloses a chemical rinse solution containing an alcohol, in particular, isobutyl alcohol. Moreover, the chemical rinse solution may contain fluorosurfactants such as 3M Novec™ fluid HFE-711 PA, -7000, -7100, -7200, and 7500, 3M Fluorinert™ FC-72, -84, -77, -3255, -3283, -40, -43, -70, -4432, 4430, and -4434, or 3M Novec™ 4200 and 4300.

For instance, 3M Novec™ 4200 is a perfluoroalkyl sulfonamide, 3M Novec™ 4300 is a perfluoroalkyl sulfonate, HFE-7000 is heptafluoro-3-methoxypropane, HFE-7100 is nonafluoro-4-methoxybutane, HFE-7200 is 1-ethoxy-nonafluorobutane, HFE-7500 is 3-ethoxy-dodecafluoro-2-(trifluoromethyl)-hexane, and HFE-711 PA is an azeotrope of 1-methoxy-nonafluorobutane and isopropanol. The 3M Fluorinert™ series surfactants are customarily used as inert perfluorinated heat transfer media.

The American patent application US 2008/0299487 A1 teaches the use of the above mentioned fluorosurfactants as additives to developer and chemical rinse solutions as well as to the immersion photoresist material. Moreover, 3M L-18691, an aqueous solution of perfluoroalkyl sulfonimide, can also be used. Additionally, the use of the following fluorosurfactants is suggested:

Rf—$SO_3^-M^+$, wherein Rf is a C1-C12 perfluoroalkyl group and $M^+$ is a cation, a proton or an ammonium group;

Rf—$SO_2N^-$—$R^1M^+$, wherein Rf and $M^+$ have the abovementioned meaning and $R^1$ is a hydrogen atom, an alkyl group, a hydroxyalkyl group, an alkylamine oxide group, an alkylcarboxylate group or an aminoalkyl group, the alkyl, hydroxyalkyl, alkylamine oxide, alkylcarboxylate and aminoalkyl groups having preferably 1-6 carbon atoms and the hydroxyalkyl having preferably the formula —$(CH_2)_x$—OH, wherein x=1-6; and Rf-Q-$R^1SO_3^-M^+$, wherein Rf and $M^+$ have the above-mentioned meaning and R1 is an alkylene of the formula —$C_nH_{2n}(CHOH)_oC_mH_{2m}$-, wherein n and m are independently of each other 1-6 and o is 0-1, and is optionally substituted by catenary oxygen or nitrogen group, Q is —O— or —$SO_2NR^2$—, wherein $R^2$ is a hydrogen atom, or an alkyl, aryl, hydroxyalkyl, aminoalkyl, or a sulfonatoalkyl group having 1-6 carbon atoms, optionally containing one or more catenary oxygen or nitrogen heteroatoms; the hydroxyalkyl group may be of the formula —$C_pH_{2p}$—OH, wherein p is 1-6; the aminoalkyl group may be of the formula —$C_pH_{2p}$—$NR^3R^4$, wherein p is 1-6 and $R^3$ and $R^4$ are independently of each other hydrogen atoms or alkyl groups of 1-6 carbon atoms.

The American patent applications US 2008/0280230 A and US 2008/0299487 A1 remain silent as to whether the chemical rinse solutions containing such an ionic fluorosurfactant can meet the ever increasing demands of the IC manufacturing industry, in particular with regard to pattern collapse in the 32 nm and sub-32 nm technology nodes.

The international patent applications WO 2008/003443 A1, WO 2008/003445 A1, WO 2008/003446 A2 and WO 2009/149807 A1 and the American patent application US 2009/0264525 A1 disclose inter alia cationic and anionic fluorosurfactants. These known fluorosurfactants find numerous applications, for example, in textile, paper, glass, building, coating, cleaner, cosmetic, herbicide, pesticide, fungicide, adhesive, metal, or mineral oil technologies as well as in special coatings for semiconductor photolithography (photoresist, top antireflective coatings, bottom antireflective coatings) [cf., for example WO 2008/003446 A2, page 14, line 29 to page 20, line 20]. The use of the fluorosurfactants for manufacturing ICs for nodes of 50 nm and lower, in particular for 32 nm nodes and lower, is not disclosed. Moreover, many of these prior art fluorosurfactants are not easily biodegradable and are therefore prone to bioaccumulation.

OBJECTS OF THE INVENTION

It is the object of the present invention to provide a method for manufacturing integrated circuits for nodes of 50 nm and lower, in particular for nodes of 32 nm and lower and, especially, for nodes of 20 nm and lower, which method no longer exhibits the disadvantages of prior art manufacturing methods.

In particular, the novel method should allow for the immersion photolithography of photoresist layers, the developing of the photoresist layers exposed to actinic radiation through a mask and/or the chemical rinse of patterned material layers comprising patterns with a high aspect ratio and line-space dimensions of 50 nm and less, in particular, of 32 nm and less, especially, of 20 nm and less, without causing pattern collapse, line edge roughness (LER) and watermark defects.

Quite to the contrary, the novel method should allow for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles in order to achieve a significant defect reduction not only on photoresist patterns but also on other patterned material layers.

Moreover, the novel method should not incur the disadvantages associated with the use of fluorosurfactants, in particular, insufficient biodegradability and bioaccumulation.

SUMMARY OF THE INVENTION

Accordingly, the novel method for manufacturing integrated circuit devices, optical devices, micromachines and mechanical precision devices has been found, the said method comprising the steps of
(1) providing a substrate having patterned material layers having line-space dimensions of 50 nm and less and aspect ratios of >2;
(2) providing the surface of the patterned material layers with a positive or a negative electrical charge by contacting the substrate at least once with an aqueous, fluorine-free solution S containing at least one fluorine-free cationic surfactant A having at least one cationic or potentially cationic group, at least one fluorine-free anionic surfactant A having at least one anionic or potentially anionic group, or at least one fluorine-free amphoteric surfactant A; and
(3) removing the aqueous, fluorine free solution S from the contact with the substrate.

Hereinafter the novel method for manufacturing integrated circuit devices, optical devices, micromachines and mechanical precision devices is referred to as the "method of the invention".

ADVANTAGES OF THE INVENTION

In view of the prior art, it was surprising and could not be expected by the skilled artisan that the objects of the invention could be solved by the method of the invention.

It was particularly surprising that the method of the invention allowed for the immersion photolithography of photoresist layers, the developing of photoresist layers exposed to actinic radiation through a mask and/or the chemical rinse of patterned material layers, in particular, patterned developed photoresist layers, comprising patterns having line-space dimensions of 50 nm and less, particularly, of 32 nm and less and, most particularly, 20 nm and less, and aspect ratios >2 in the case of photoresist structures, and, in particular, >10 in the case of non-photoresist structures, without causing pattern collapse, line edge roughness (LER) and watermark defects.

In the art, structures having aspect ratios >10 are frequently referred to as "high aspect ratio stacks".

Quite to the contrary, the method of the invention allowed for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles whereby a significant defect reduction not only on photoresist patterns but also on other patterned material layers could be achieved.

Additionally, the method of the invention could be most advantageously applied to photoresist patterns prepared not only from immersion photoresist layers but also from extreme UV (EUV) photoresist layers and electron beam (eBeam) photoresist layers.

Moreover, the method of the invention did not incur the disadvantages associated with the use of fluorosurfactants, in particular, insufficient biodegradability and bioaccumulation.

DETAILED DESCRIPTION OF THE INVENTION

In its broadest aspect, the present invention is directed to a method of manufacturing integrated circuit (IC) devices, optical devices, micromachines and mechanical precision devices, in particular IC devices.

Any customary and known substrates used for manufacturing IC devices, optical devices, micromachines and mechanical precision devices can be used in the process of the invention. Preferably, the substrate is a semiconductor substrate, more preferably a silicon wafer including a silicon-gallium wafer, which wafers are customarily used for manufacturing IC devices, in particular IC devices comprising ICs having LSI, VLSI and ULSI.

In the first step of the method of the invention, a substrate is provided having patterned material layers having line-space dimensions of 50 nm and less, in particular, 32 nm and less and, especially, 20 nm and less, i.e. patterned material layers for the sub-20 nm technology nodes. The patterned material layers have ratios >2, preferably >10, even more preferably >50. In particular, when the patterned material layers comprise or consist of photoresist structures the ratios are >2 and when they comprise or consist of non-photoresist structures the ratios are >10. Most preferably, the aspect ratio is in the range of up to 75, as for example, for 15 nm flash devices.

The patterned material layers can be patterned developed photoresist layers, patterned barrier material layers containing or consisting of ruthenium, titanium nitride, tantalum or tantalum nitride, patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon and metals; and patterned dielectric material layers containing or consisting of silicon dioxide or low-k or ultra-low-k dielectric materials.

In the second step of the method of the invention, the surface of the patterned material layers is provided with a positive or a negative electrical charge by contacting the semiconductor substrate at least once with an aqueous, fluorine-free solution S containing at least one fluorine-free ionic surfactant A having at least one cationic or potentially cationic group or having at least one anionic or potentially anionic group.

"Aqueous" means that the aqueous, fluorine-free solution S contains the water, preferably deionized water and, most preferably ultrapure water as the main solvent. The aqueous, fluorine-free solution S may contain water-miscible polar organic solvents, albeit only in such minor amounts that do jeopardize the aqueous nature of the solution S.

"Fluorine-free" means that the concentration of fluoride ions or covalently bonded fluorine in the solution S is below the detection limit of customary and known methods for quantitatively or qualitatively detecting fluorine.

The aqueous, fluorine-free solution S can be applied in accordance with any known methods customarily used for contacting solid surfaces with liquids, as for example, dipping the substrates into the solution S or spraying, dropping or puddling the solution S onto the substrate surface.

The aqueous, fluorine-free solution S contains at least one, preferably one, fluorine-free cationic surfactant A having at least one cationic or potentially cationic group, at least one, preferably one, fluorine-free anionic surfactant A having at least one anionic or potentially anionic group, or at least one, preferably one, fluorine-free amphoteric surfactant.

Preferably, the at least one cationic or potentially cationic group contained in the fluorine-free cationic surfactant A is selected from the group consisting of primary, secondary and tertiary amino groups, primary, secondary, tertiary and quaternary ammonium groups, uronium-, thiouronium-und guanidinium groups, quaternary phosphonium groups and tertiary sulfonium groups.

Preferably, the secondary and tertiary amino groups, the secondary, tertiary and quaternary ammonium groups, the tertiary sulfonium groups and the quaternary phosphonium groups can comprise any organic residues as long as these residues do not jeopardize the hydrophilic nature of the cationic or potentially cationic group. More preferably, the organic residues are selected from the group consisting of substituted and unsubstituted, preferably unsubstituted, alkyl groups having 1 to 10 carbon atoms, cycloalkyl groups having 5 to 12 carbon atoms, aryl groups having 6 to 16 carbon atoms and alkylcycloalkyl groups, alkylaryl groups, cycloalkylaryl groups and alkylcycloalkylaryl groups containing or consisting of the aforementioned alkyl, cycloalkyl and aryl groups.

Moreover, the secondary and tertiary amino groups and the secondary, tertiary and quaternary ammonium groups can be integral constituents of cationic substituted and unsubstituted, preferably unsubstituted, heterocyclic groups, preferably selected from the group consisting of pyrrolium-, imidazolium-, imidazolinium, 1H-pyrazolium-, 3H-pyrazolium-, 4H-pyrazolium-, 1-pyrazolinium-, 2-pyrazolinium-, 3-pyrazolinium-, 2,3-dihydro-imidazolinium-, 4,5-dihydro-imidazolinium-, 2,5-dihydro-imidazolinium-, pyrrolidinium-, 1,2,4-triazolium-(quaternary nitrogen atom in 1-position), 1,2,4-triazolium-(quaternary nitrogen atom in 4-position), 1,2,3-triazolium-(quaternary nitrogen in 1-position), 1,2,3-triazolium-(quaternary nitrogen in 4-position), oxazolium-, oxazolinium isooxazolium-, thiazolium-, isothiazolium-, pyridinium-, pyridazinium-, pyrimidinium-, piperidinium-, morpholinium-, pyrazinium-, indolium-, chinolinium-, isochinolinium-, chinoxalinium-und indolinium-cations.

The aforementioned substituted organic moieties and cationic heterocyclic groups contain inert substituents, i.e., substituents which do not cause undesired effects such as decomposition or condensation reactions or the formation of precipitates. Examples for suitable substituents are nitrile groups, nitro groups and chlorine atoms.

Preferably, the counterions of the cationic groups are selected from the group consisting of anions of volatile inorganic and organic acids, in particular, HCl, formic acid, acetic acid and salicylic acid.

Preferably, the potentially anionic and anionic groups of the fluorine-free anionic surfactants A are selected from the group consisting of carboxylic acid, sulfonic acid, phosphonic acid, sulfuric acid monoester, phosphoric acid monoester and phosphoric acid diester groups and carboxylate, sulfonate, phosphonates, monoester sulfate, monoester phosphate and diester phosphate groups.

Preferably, the counterions of the anionic groups are selected from the group consisting of ammonium, lithium, sodium, potassium and magnesium cations. Most preferably, ammonium is used as the counterion.

In addition to the above described potentially ionic or ionic hydrophilic groups, the surfactants A can contain nonionic hydrophilic groups customarily used in nonionic surfactants. Preferably, the nonionic hydrophilic groups selected from the group consisting of hydroxy groups, —O—, —S—, —C(O)—, —C(S)—, —C(O)—O—, —O—C(O)—O—, —O—C(S)—O—, —O—Si(—R)$_2$—, —N=N—, —NR—C(O)—, —NR—NR—C(O)—, —NR—NR—C(S)—, —O—C(O)—NR—, —O—C(S)—NR—, —NR—C(O)—NR—, —NR—C(S)—NR—, —S(O)—, —S(O)$_2$—, —O—S(O)$_2$—, —NR—S(O)$_2$—, —P(O)$_2$—O—, sorbitol, glucose, fructose, oligoglucose, saccharose, polyoxyethylene groups, polyoxypropylene and polyoxyethylene-polyoxypropylene groups.

The anionic and cationic surfactants A contain at least one hydrophobic group. Preferably, any suitable hydrophobic group customarily used in ionic surfactants can be used. Most preferably, the hydrophobic groups are selected from the group consisting of substituted and unsubstituted, preferably, unsubstituted, branched and unbranched, saturated and unsaturated alkyl groups having 5 to 30 carbon atoms, cycloalkyl groups having 5 to 20 carbon atoms, aryl groups having 6 to 20 carbon atoms, alkylcycloalkyl groups, alkylaryl groups, cycloalkylaryl groups and alkylcycloalkylaryl containing or consisting of the aforementioned alkyl, cycloalkyl and aryl groups, and polysiloxane groups.

The aforementioned substituted hydrophobic groups contain inert substituents, i.e., substituents which do not jeopardize the hydrophobic nature of the group and do not cause undesired effects such as decomposition or condensation reactions or the formation of precipitates. Examples for suitable substituents are nitrile groups, nitro groups, fluorine atoms, and pentafluorosulfanyl groups.

Preferably, the fluorine-free amphoteric surfactant A is selected from the group consisting of alkylamine oxides, in particular alkyldimethylamine oxides; acyl-/dialkylethylendiamines, in particular sodium acylamphoacetate, disodium acylamphodipropionate, disodium alkylamphodiacetate, sodium acylamphohydroxypropylsulfonate, disodium acylamphodiacetate, sodium acyl-amphopropionate, and N-coconut fatty acid amidoethyl-N-hydroxyethylglycinate sodium salts; N-alkylamino acids, in particular aminopropyl alkylglutamide, alkylaminopropionic acid, sodium imidodipropionate and lauroamphocarboxyglycinate.

The fluorine-free surfactants A are customary and known commercially available materials and are described, for example, in Römpp Online 2011, "Cationic Surfactants", "Anionic Surfactants" and "Amphoteric Surfactants".

The concentration of the fluorine-free cationic, anionic or amphoteric surfactants A in the aqueous, fluorine-free solution S primarily depends on the critical micelle concentration value (CMC value). Therefore, the concentration can vary broadly and, therefore, can be adapted most advantageously to the particular requirements of a given method of the invention. Preferably, the concentration is in the range of 0.0005 to 1% by weight, preferably 0.005 to 0.8% by weight and, most preferably, 0.01 to 0.6% by weight, the weight percentages being based on the complete weight of the solution S.

The aqueous, fluorine-free solution S may contain water-miscible polar organic solvents. Examples of suitable solvents are described in the American patent application US 2008/0280230 A, page 2, paragraph [0016]. Most preferably, the aqueous, fluorine-free solution S does not contain any organic solvents.

In accordance with the method of the invention, the aqueous, fluorine-free solution S can be used for different purposes and objects. Thus, it can be used as an immersion liquid S for immersing photoresists during irradiation with actinic light through a mask, as a developer solution S for photoresist layers exposed to actinic radiation through a mask and as a chemical rinse solution S for rinsing the patterned material layers.

In the third step of the method of the invention, the aqueous solution S is removed from the contact with the substrate. Any known methods customarily used for removing liquids from solid surfaces can be employed. Preferably, the solution S is removed by spin drying or drying processes making use of the Marangoni effect.

Preferably, in the first step of the method of the invention, the substrate is provided by a photolithographic process comprising the steps of
(i) providing the substrate with an immersion photoresist layer, an extreme UV (EUV) photoresist layer or an electron beam (eBeam) photoresist layer;
(ii) exposing the photoresist layer to actinic radiation through a mask with or without an immersion liquid;
(iii) developing the exposed photoresist layer with a developer solution to obtain a pattern having line-space dimensions of 50 nm and less, in particular, of 32 nm and less and, most especially, of 20 nm and less and an aspect ratio >2, preferably >10, even more preferably >50 and, most preferably, up to 75 nm;
(iv) applying a chemical rinse solution to the developed patterned photoresist layer; and
(v) drying the semiconductor substrate after the application of the chemical rinse, solution preferably by spin drying or drying processes making use of the Marangoni effect.

Any customary and known immersion photoresist, EUV photoresist or eBeam photoresist can be used. The immersion photoresist may already contain at least one fluorine-free cationic, anionic or amphoteric surfactant A. Additionally, the immersion photoresist can contain nonionic surfactants. Suitable nonionic surfactants are described, for example, in the American patent application US 2008/0299487 A1, page 6, paragraph [0078]. Most preferably, the immersion photoresist is a positive resist.

Besides eBeam exposure or EUV radiation of of a wavelength of about 13.5 nm, UV radiation of a wavelength of 193 nm is preferably used as the actinic radiation.

In the case of immersion lithography, ultra-pure water is preferably used as the immersion liquid. More preferably, the immersion liquid contains at least one fluorine-free cationic, anionic or amphoteric surfactant A.

Any customary and known developer solution can be used for developing the exposed photoresist layer. Preferably, aqueous developer solutions containing tetramethylammonium hydroxide (TMAH) are used. More preferably, the aqueous developer solutions contain at least one fluorine-free ionic surfactant A.

Preferably, the chemical rinse solutions are aqueous solutions. More preferably, the aqueous developer solutions contain at least one fluorine-free cationic, anionic or amphoteric surfactant A.

Preferably, the chemical rinse solutions are applied to the exposed and developed photoresist layers as puddles.

It is essential for photolithographic process according to the method of the invention, that at least one of the following: the immersion solution S, the developer solution S or the chemical rinse solution S contains at least one fluorine-free ionic surfactant A. Most preferably, the at least one fluorine-free cationic, anionic or amphoteric surfactant A is contained in the chemical rinse solution S.

Customary and known equipment customarily used in the semiconductor industry can be used for carrying out the photolithographic process in accordance with the method of the invention.

Figure 2:
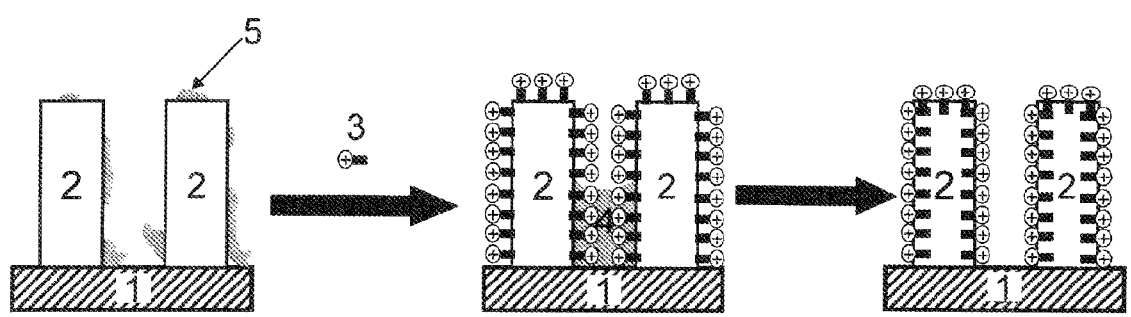
Figure 3:
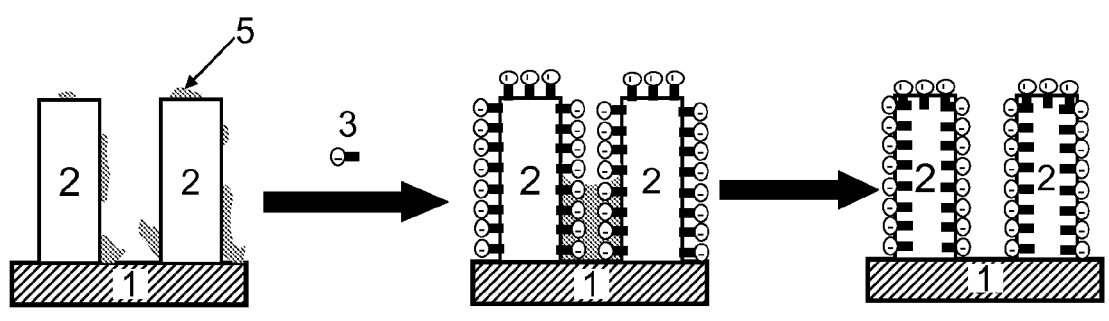

Without wishing to be bound by any theory, it is believed that the positive or negative electrical charge of the surface of the patterned layered materials causes a mutual electrostatic repulsion of neighbouring surfaces which prevents pattern collapse, as illustrated by the FIGS. 1, 2 and 3.

As the FIGS. 1 to 3 are of exemplary nature, the depicted spatial and dimensional relationships is not to be construed as an exact replica of the practical conditions.

In the FIGS. 1, 2 and 3, the reference numbers have the following meaning.
1 Substrate,
2 photoresist or high aspect ratio stack,
3 fluorine-free cationic, anionic or amphoteric surfactant A,
4 cleaning solution containing no fluorine-free cationic, anionic or amphoteric surfactant A, and
5 particles and residues.

FIG. 1 illustrates how the photoresist structures or a high aspect ratio stacks 2 are drawn towards each other by the capillary forces of the evaporating cleaning solution 4, which capillary forces lead to pattern collapse.

FIG. 2 illustrates the beneficial effect which is achieved when the fluorine-free cationic surfactant A 3 is added to the cleaning solution 4, resulting in an aqueous fluorine-free solution S. The solution S effectively removes the particles and residues 5. Moreover, upon the evaporation of the solution S, some of the fluorine-free cationic surfactant A 3 is left on the surface of the structures, thereby creating a repulsive electrostatic force which prevents the pattern collapse.

FIG. 3 illustrates the beneficial effect which is achieved when the fluorine-free anionic surfactant A 3 is added to the cleaning solution 4, resulting in an aqueous fluorine-free solution S. The solution S effectively removes the particles and residues 5. Moreover, upon the evaporation of the solution S, some of the fluorine-free anionic surfactant A 3 is left on the surface of the structures, thereby creating a repulsive electrostatic force which prevents the pattern collapse.

EXAMPLE

The Manufacture of Patterned Photoresist Layers having Features with Line-Space Dimensions of 20 Nm with an Aspect Ratio of 50 Using a Fluorine-Free Ionic Surfactant Silicon wafers were provided with 1000 nm thick layers of an immersion photoresist. The photoresist layers were exposed to UV radiation of a wavelength of 193 through a mask using ultrapure water as the immersion liquid. The mask contained features having dimensions of 20 nm. Thereafter, the exposed photoresist layers were baked and developed with an aqueous developer solution containing TMAH. The baked and developed photoresist layers were subjected to a chemical rinse treatment using a chemical rinse solution containing 0.02% by weight of a fluorine-free cationic surfactant. The chemical rinse solution was applied as a puddle. Thereafter, the silicon wafers were spun dry. The dried silicon wafers did not show any watermarks. It could be corroborated by scanning electron microscopy (SEM) and atomic force microscopy (AFM) that the dried patterned photoresist layers having patterns with line-space dimensions of 20 nm and an aspect ratio of 50 did not show any pattern collapse.

We claim:

1. A method for manufacturing a device, the method comprising:
    (1) contacting a substrate having patterned material layers having line-space dimensions of 50 nm and less and aspect ratios of >2 at least once with an aqueous, fluorine-free solution S comprising i) a fluorine-free cationic surfactant A comprising a cationic or potentially cationic group, ii) a fluorine-free anionic surfactant A comprising an anionic or potentially anionic group, or iii) a fluorine-free amphoteric surfactant A, thereby providing a surface of the patterned material layers with a positive or a negative electrical charge, wherein a repulsive electrostatic force is created; and
    (2) removing the aqueous, fluorine-free solution S from the contact with the substrate,
    wherein the patterned material layers are patterned developed photoresist layers, patterned barrier material layers, patterned multi-stack material layers, or pattern dielectric material layers.

2. The method of claim 1, wherein the substrate is a semiconductor substrate.

3. The method of claim 1, wherein the patterned material layers comprise photoresist structures and have line-space dimensions of 32 nm and less and aspect ratios of >10.

4. The method of claim 1, wherein the aqueous, fluorine-free solution S is an immersion liquid S for immersing photoresists during irradiation with actinic light through a mask, a developer solution S for photoresists layers exposed to actinic radiation through a mask and an immersion liquid, and/or a chemical rinse solution S for rinsing the patterned material layers.

5. The method of claim 1, wherein the potentially cationic and cationic groups are selected from the group consisting of primary, secondary and tertiary amino groups, primary, secondary, tertiary and quaternary ammonium groups, uronium-, thiouronium- and guanidinium groups, quaternary phosphonium groups and tertiary sulfonium groups; and that the potentially anionic and anionic groups are selected from the group consisting of carboxylic acid, sulfonic acid, phosphonic acid, sulfuric acid monoester, phosphoric acid monoester and phosphoric acid diester groups and carboxylate, sulfonate, phosphonates, monoester sulfate, monoester phosphate and diester phosphate groups.

6. The method of claim 1, wherein the aqueous, fluorine-free solution S comprises, based on a complete weight of the aqueous, fluorine-free solution S, from 0.0005 to 1% by weight of the ionic surfactant A.

7. The method of claim 1, wherein the aqueous, fluorine-free solution S is removed from the contact with the substrate by spin drying or drying processes employing the Marangoni effect.

8. The method of claim 1, wherein the substrate having patterned material layers having line-space dimensions of 50 nm and less and aspect ratios of >2 is obtained by a photolithographic process.

9. The method of claim 8, wherein the photolithographic process comprises:
  (i) providing the substrate with an immersion photoresist layer, an extreme UV (EUV) photoresist layer, or an electron beam (eBeam) photoresist layer;
  (ii) exposing the photoresist layer to actinic radiation through a mask with or without an immersion liquid;
  (iii) developing the exposed photoresist layer with a developer solution to obtain a pattern having line-space dimensions of 50 nm and less and an aspect ratio >2;
  (iv) applying a chemical rinse solution to the developed patterned photoresist layer; and then
  (v) spin drying the substrate after the application of the chemical rinse solution;
  wherein at least one of the following: the immersion liquid, the developer solution and the chemical rinse solution, is an aqueous, fluorine-free solution S.

10. The method of claim 1, which prevents pattern collapse, reduces line edge roughness, prevents and removes watermark defects, and reduces defects by removing particles.

11. The method of claim 1, wherein the patterned material layers comprise non-photoresist structures and have line-space dimensions of 32 nm and less and aspect ratios of >2.

12. The method of claim 1, wherein the aqueous, fluorine-free solution S comprises, based on a total weight of the solution S, from 0.005 to 0.8% by weight of i) the fluorine-free cationic surfactant A.

13. The method of claim 1, wherein the content of the i) fluorine-free cationic surfactant A is from 0.01 to 0.6% by weight, based on a total weight of the aqueous, fluorine-free solution S.

14. The method of claim 1, wherein the aqueous, fluorine-free solution S comprises, based on a total weight of the solution S, from 0.005 to 0.8% by weight of ii) the fluorine-free anionic surfactant A.

15. The method of claim 1, wherein the content of the ii) fluorine-free anionic surfactant A is from 0.01 to 0.6% by weight, based on a total weight of the aqueous, fluorine-free solution S.

16. The method of claim 1, wherein the aqueous, fluorine-free solution S comprises, based on a total weight of the aqueous, fluorine-free solution S, from 0.005 to 0.8% by weight of iii) the fluorine-free amphoteric surfactant A.

17. The method of claim 1, wherein the content of the iii) fluorine-free amphoteric surfactant A is from 0.01 to 0.6% by weight, based on a total weight of the aqueous, fluorine-free solution S.

18. The method of claim 1, wherein the device is an integrated circuit device, an optical device, a micromachine, or a mechanical precision device.

19. The method of claim 18, wherein the device is an integrated circuit device, which is an integrated circuit having a large-scale integration (LSI), very-large-scale integration (VLSI), or the ultra-large-scale integration (ULSI).

* * * * *